(12) United States Patent
Senda et al.

(10) Patent No.: US 7,250,357 B2
(45) Date of Patent: Jul. 31, 2007

(54) MANUFACTURING METHOD FOR STRAINED SILICON WAFER

(75) Inventors: Takeshi Senda, Niigata (JP); Koji Izunome, Niigata (JP)

(73) Assignee: Toshiba Ceramics Co., Ltd., Tokyo (JP)

( * ) Notice: Subject to any disclaimer, the term of this patent is extended or adjusted under 35 U.S.C. 154(b) by 23 days.

(21) Appl. No.: 11/220,983

(22) Filed: Sep. 8, 2005

(65) Prior Publication Data

US 2006/0057856 A1 Mar. 16, 2006

(30) Foreign Application Priority Data

Sep. 9, 2004 (JP) ............................ P2004-262274

(51) Int. Cl.
*H01L 21/20* (2006.01)
(52) U.S. Cl. ...................... 438/478; 438/503; 438/507; 257/190; 257/192
(58) Field of Classification Search ................ 438/503, 438/507, 607, 603; 257/18, 19, 191, 190, 257/192
See application file for complete search history.

(56) References Cited

U.S. PATENT DOCUMENTS 5,221,413 A 6/1993 Brasen et al.

2004/0005740 A1* 1/2004 Lochtefeld et al. ......... 438/149
2005/0023646 A1* 2/2005 Lee et al. .................... 257/616

FOREIGN PATENT DOCUMENTS

| JP | 2792785 B2 | 6/1998 |
| JP | 2002-118254 A | 4/2002 |
| JP | 2003-197544 A | 7/2003 |
| WO | WO 2005078786 | * 1/2004 |

OTHER PUBLICATIONS

Kidd et.al , "Comaparison of the crystalline quality of step-graded and continuosly graded InGaAs buffer layers",),Jun. 14, 1996, Journal of Crystal Growth 169(1996),649-659.*

* cited by examiner

*Primary Examiner*—Matthew Smith
*Assistant Examiner*—Ankush Singal
(74) *Attorney, Agent, or Firm*—Foley & Lardner LLP

(57) ABSTRACT

A manufacturing method for producing a stained silicon wafer has the steps of forming an $Si_{1-x}Ge_x$ composition-graded layer of which Ge concentration is stepwisely increased on a single crystal silicon substrate, forming an $Si_{1-x}Ge_x$ uniform composition layer of which Ge concentration is constant on the $Si_{1-x}Ge_x$ composition-graded layer, forming a stain-relaxed $Si_{1-y}Ge_y$ layer of which Ge concentration y is constant while y satisfies relationship of $0.5x \leq y < x$ on the $Si_{1-x}Ge_x$ uniform composition layer and epitaxially growing a strained Si layer on the strain-relaxed $Si_{1-y}Ge_y$ layer.

7 Claims, 1 Drawing Sheet

MANUFACTURING METHOD FOR
STRAINED SILICON WAFER

The present invention claims foreign priority to Japanese patent application no. P.2004-262274, filed on Sep. 9, 2004, the contents of which is incorporated herein by reference.

BACKGROUND OF THE INVENTION

1. Field of the Invention

The present invention relates to a manufacturing method for a silicon wafer reduced in the penetrating dislocation density by stacking an SiGe layer and a strained Si layer on a silicon substrate.

2. Description of the Background Art

In recent years, a stained silicon wafer obtained by epitaxially growing an SiGe layer on a single crystal silicon substrate and epitaxially growing a strained Si layer on the SiGe layer has been proposed.

In the strained Si layer, a tensile strain is generated due to the SiGe layer having a large lattice constant as compared with Si. This generated strain causes a change in the band structure of Si to release the degeneracy. As a result, the carrier mobility increases.

Accordingly, when this strained Si layer is used as a channel region, a carrier mobility as high as 1.5 times or more that in the case of using a normal bulk silicon can be realized.

For this reason, the strained silicon wafer is attracting attention as a wafer suitable for high-speed MOSFET, MODFET, HEMT and the like.

In order to obtain a good strained Si layer in such a strained silicon wafer, a good SiGe layer, that is, an SiGe layer having a low penetrating dislocation density, a relaxed strain and a smooth surface, must be epitaxially grown as the underlay on a silicon substrate.

However, at the epitaxial growth of an SiGe layer on a silicon substrate, misfit dislocations are generated due to difference in the lattice constant between Si and SiGe, and penetrating dislocations attributable to the misfit dislocations reach the surface at a high density, which brings about a problem that dislocations similarly at a high density are generated also in the strained Si layer formed on the SiGe layer.

Dislocations in the strained Si layer give rise to increase in the junction leak current at the formation of a device element.

Furthermore, there arises a problem that unevenness called cross-hatch is generated on the strained Si layer surface due to penetrating dislocations and residual strain energy. In order to reduce the penetrating dislocation density, various proposals have been heretofore made.

For example, Japanese Patent Examined Publication No. JP-B-2792785 discloses a manufacturing method of a semiconductor device, where an SiGe hierarchy layer of which Ge component is increased at a concentration gradient of about 25%/µm or less is epitaxially grown on a single crystal silicon substrate, an SiGe cap layer of which Ge concentration is constant is then grown, and a strained Si layer is epitaxially grown thereon.

Japanese Patent Unexamined Patent Publication No. JP-A-2002-118254 discloses that in a semiconductor wafer comprising a silicon substrate having thereon a compositionally stepwisely gradient SiGe layer of which Ge compositional ratio gradually increased, an SiGe relaxing layer of which Ge compositional ratio is constant and a strained Si layer. In the semiconductor wafer, the penetrating dislocation density can be reduced by increasing the number of steps.

Japanese Patent Unexamined Patent Publication No. JP-A-2003-197544 discloses a semiconductor substrate wherein the first SiGe layer has a thickness smaller than two times the critical film thickness of causing generation of dislocations due to increase in the film thickness and bringing about lattice relaxation; the second SiGe layer comprises a stepped laminate of multiple layers consisting of an SiGe gradient composition layer of which Ge compositional ratio gradually increasing toward the surface and an SiGe constant composition layer having the same Ge compositional ratio as that on the top surface of the gradient composition layer and being disposed on the gradient composition layer, which are stacked alternately to give a continuous Ge compositional ratio, and the Ge compositional ratio on the bottom surface of the second SiGe layer is lower than the maximum Ge compositional ratio in the first SiGe layer.

As described above, various methods have been proposed with an attempt to reduce the penetrating dislocation density in a strained silicon wafer.

However, in Japanese Patent Examined Publication No. JP-B-2792785, the penetrating dislocation density in Examples is still on the $10^5$ cm$^{-2}$ order. Such a high penetrating dislocation density may greatly affect the yield in the device process.

Similarly, even in the semiconductor wafer described in Japanese Patent Unexamined Patent Publication No. JP-A-2002-118254, it is difficult to reduce the penetrating dislocation density in the strained Si layer to less than $10^5$ cm$^{-2}$.

Also, even in the semiconductor substrate described in Japanese Patent Unexamined Patent Publication No. JP-A-2003-197544, when the thickness of the strained Si layer is 20 nm or more, the penetrating dislocation density is not successfully reduced to such an extent as being capable of responding to the level required of the device working region.

Accordingly, in order to realize more speeding up of the operation in MOSFET and the like, a high-quality strained silicon wafer more reduced in the penetrating dislocation density is demanded.

SUMMARY OF THE INVENTION

The present invention has been made to solve those technical problems and an object of the present invention is to provide a manufacturing method for a strained silicon wafer having an SiGe layer, where the penetrating dislocation density in a strained Si layer formed on the SiGe layer can be more reduced.

According to a first aspect of the present invention, there is provided a manufacturing method for producing a stained silicon wafer, comprising the steps of:

forming an $Si_{1-x}Ge_x$ composition-graded layer of which Ge concentration is stepwisely increased on a single crystal silicon substrate;

forming an $Si_{1-x}Ge_x$ uniform composition layer of which Ge concentration is constant on the $Si_{1-x}Ge_x$ composition-graded layer;

forming a stain-relaxed $Si_{1-y}Ge_y$ layer of which Ge concentration y is constant while y satisfies relationship of $0.5x \leq y < x$ on the $Si_{1-x}Ge_x$ uniform composition layer; and epitaxially growing a strained Si layer on the strain-relaxed $Si_{1-y}Ge_y$ layer.

By passing through these steps, the penetrating dislocation density in the strained Si layer can be more reduced and the strained Si layer can be formed to a thickness larger than the critical film thickness of a strained Si having a lattice constant corresponding to the maximum Ge concentration of the stain-relaxed SiGe layer.

In this way, by forming the $Si_{1-y}Ge_y$ layer having a Ge concentration lower than the maximum Ge concentration in the $Si_{1-x}Ge_x$ layer before the strained Si layer is formed, the critical film thickness of allowing for abrupt increase of the penetrating dislocation density can be made large and in turn, an Si layer reduced in the penetrating dislocation density and having a larger film thickness can be formed.

As described above, according to the present invention, the penetrating dislocation density in a strained silicon wafer can be more reduced relative to the conventional technique, and also, a strained layer having a larger film thickness can be formed.

The strained silicon wafer of the present invention has such a high-quality strained Si layer, so that when the strained Si layer is used as the device activity region, the degree of freedom in the device process can be elevated and high carrier mobility can be realized. Therefore, the strained silicon wafer of the present invention can be suitably used for LSI, a discrete semiconductor device and the like in or after the next generation.

DETAILED DESCRIPTION OF THE PREFERRED EMBODIMENTS

Figure 1:
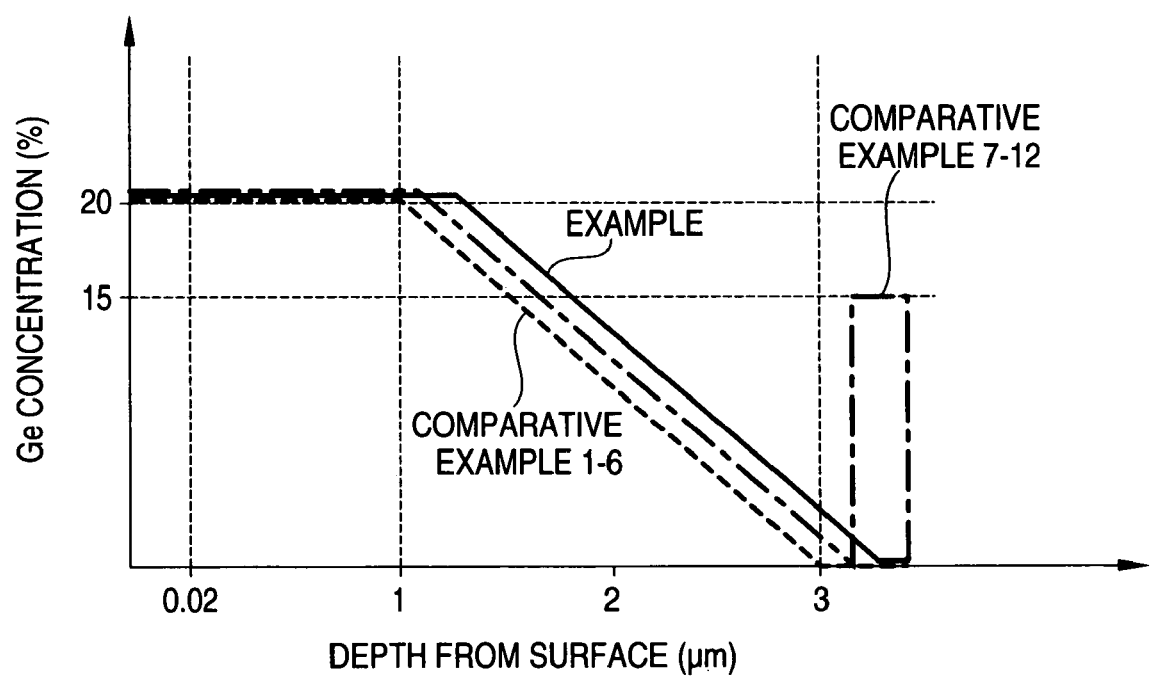
FIG. 1 is a graph simply showing the Ge concentration profile with respect to the depth from the surface of SiGe layer in Examples and Comparative Examples.

The present invention is described in detail below

The strained silicon wafer of the present invention can be obtained by first forming an $Si_{1-x}Ge_x$ layer on a single crystal silicon substrate, and then sequentially stacking thereon an $Si_{1-y}Ge_y$ layer with the Ge concentration y being $0.5x \leq y < x$ and a strained Si layer.

The strained silicon wafer can be obtained by the manufacturing method of the present invention comprising passing through a step of forming an $Si_{1-x}Ge_x$ composition-graded layer of which Ge concentration is stepwisely increased on a single crystal silicon substrate, a step of forming an $Si_{1-x}Ge_x$ uniform composition layer of which Ge concentration is constant, a step of forming a stain-relaxed $Si_{1-y}Ge_y$ layer of which Ge concentration y being constant and $0.5x \leq y < x$, and a step of epitaxially growing a strained Si layer on the strain-relaxed $Si_{1-y}Ge_y$ layer.

As for the single crystal silicon substrate for use in the present invention, for example, a silicon prime substrate is suitably used, which is a P-type boron-doped substrate cut out from a single crystal ingot withdrawn by the Czochralski (CZ) process and in which the azimuth is (100), the resistivity is 0.1 Ωcm or more, and the initial oxygen concentration is $15 \times 10^{17}$ atoms/cm$^3$ or less. Of course, a substrate other than the CZ substrate, for example, an FZ substrate can also be used.

The surface of this single crystal silicon substrate is preferably mirror-polished.

The $Si_{1-x}Ge_x$ layer formed on the single crystal silicon substrate may be a uniform composition layer of which the Ge concentration is constant, but in order to more reduce the dislocation density, this layer is preferably a composition-graded layer of which the Ge concentration x gradually increases from the silicon substrate side.

The Ge concentration x in the $Si_{1-x}Ge_x$ layer is preferably $0.1 \leq x \leq 0.8$ and in the case of a composition-graded layer, the layer is preferably formed such that the Ge concentration increases at a gradient of less than 25%/µm.

If the thickness of the $Si_{1-x}Ge_x$ composition-graded layer is less than 1 µm, insufficient stain results, whereas even if the thickness exceeds 3 µm, the desired stain amount is not so changed. Therefore, the thickness of the $Si_{1-x}Ge_x$ composition-graded layer is preferably from 1 to 3 µm.

In the case where the $Si_{1-x}Ge_x$ layer is formed as a composition-graded layer, the uppermost layer having a maximum Ge concentration is preferably formed to a large film thickness so as to relax the strain generated due to the $Si_{1-x}Ge_x$ layer.

In other words, an $Si_{1-x}Ge_x$ uniform composition layer having the same Ge concentration as the Ge concentration achieved in the uppermost layer of the composition-graded layer is preferably formed as a strain-relaxing layer.

From the standpoint of satisfactorily relaxing the strain generated due to the $Si_{1-x}Ge_x$ composition-graded layer, the $Si_{1-x}Ge_x$ uniform composition layer ($Si_{1-x}Ge_x$ relaxing layer) is preferably formed to a thickness of 500 to 1,000 nm.

Then, an $Si_{1-y}Ge_y$ layer having a Ge concentration y satisfying the relationship of $0.5x \leq y < x$ with respect to the Ge concentration x of the $Si_{1-x}Ge_x$ uniform composition layer is stacked, and a strained Si layer working out to a device active layer is further stacked thereon, whereby a strained silicon wafer according to the present invention is obtained.

In view of the lattice mismatch ratio ascribable to the Ge concentrations x and y, the $Si_{1-y}Ge_y$ layer is preferably formed to a film thickness of approximately from 10 to 200 nm and also formed of a uniform composition of which the Ge concentration y is constant.

In a strained silicon wafer, as the film thickness of the strained Si layer increases, the penetrating dislocation density increases due to generation of misfit dislocations ascribable to the lattice mismatch between the single crystal silicon substrate and the SiGe layer.

On the other hand, in the strained silicon wafer of the present invention, for example, an $Si_{0.85}Ge_{0.15}$ layer having a Ge concentration y of 15% and a small lattice constant is stacked on an $Si_{0.8}Ge_{0.2}$ layer having a Ge concentration x of 20%, whereby a tensile stress strain can be generated in the $Si_{0.85}Ge_{0.15}$ layer, the stress applied to the strained Si layer thereon can be reduced, and the film thickness of allowing for generation of many misfit dislocations can be increased (see, Examples).

That is, even when the thickness of the strained layer is made larger than ever before, generation of penetrating dislocations hardly occurs and the penetrating dislocation density can be reduced.

In this way, by stacking the strained Si layer on the $Si_{1-y}Ge_y$ layer, the stained Si layer can be formed to a thickness larger than the critical film thickness of a strained Si having a lattice constant larger than that of a single crystal silicon substrate and having a lattice constant corresponding to the Ge concentration of the $Si_{1-x}Ge_x$ uniform composition layer (uppermost layer of the $Si_{1-x}Ge_x$ layer).

The strained Si layer works out to a device active region and is preferably formed to a film thickness of 5 to 50 nm, which is a thickness large enough to exceed the critical film thickness for the $Si_{1-x}Ge_x$ layer, though this varies depending on the allowable penetrating dislocation density.

The $Si_{1-x}Ge_x$ layer and the $Si_{1-y}Ge_y$ layer can be epitaxially grown, for example, by a vapor-phase epitaxy method such as CVD method using lamp heating and CVD method in ultrahigh vacuum (UHV-CVD), or a molecular beam epitaxy method (MBE).

The growth conditions vary depending on, for example, the compositional ratio of Si and Ge or film thickness of the SiGe layer to be grown or the growth method or apparatus used and may be appropriately set, but the growth is performed, for example, under the conditions of carrier gas: $H_2$, raw material gas: $SiH_4$ and $GeH_4$, and chamber pressure: from 10 to 100 Torr. As for the growth temperature, in the case of forming the $Si_{1-x}Ge_x$ layer, a higher temperature is more effective in reducing the dislocation density and the growth temperature is preferably from 800 to 1,100° C.

Incidentally, the surface of the $Si_{1-y}Ge_y$ layer is preferably smoothed, for example, by a high-temperature hydrogen heat treatment in an $H_2$ stream at 850 to 1,200° C. under a pressure of about 10 to 760 Torr.

By this treatment, the surface of the strained Si layer formed-thereon becomes smooth and the generation of dislocations can be suppressed.

On the thus-formed $Si_{1-y}Ge_y$ layer, the strained Si layer is stacked, for example, through epitaxial growth of a single crystal Si layer by a CVD method or the like.

The formation of the strained Si layer by the CVD method is performed under the conditions of, for example, carrier gas: $H_2$, raw material gas: $SiH_2Cl_2$ or $SiH_4$, chamber pressure: from 10 to 760 Torr, and temperature: from 650 to 1,000° C. The growth temperature is preferably 800° C. or less.

The strained silicon wafer having formed therein such a strained Si layer with a low penetrating dislocation density can realize a high carrier mobility in the strained Si layer and can be used as a suitable substrate for the formation of a high-speed device.

EXAMPLES

The present invention is described in greater detail below by referring to Examples, but the present invention is not limited to these Examples.

Examples 1 to 6

On the mirror-polished surface of a single crystal silicon substrate, an $Si_{1-x}Ge_x$ composition-graded layer of which the Ge concentration x is varied in 10 steps within the range of $0 \leq x \leq 0.2$ was epitaxially grown to a film thickness of 2 μm.

Subsequently, an $Si_{0.8}Ge_{0.2}$ uniform composition layer of which the Ge concentration is constantly 20% was epitaxially grown thereon as a strain-relaxing layer to a film thickness of 1 μm.

Furthermore, an $Si_{0.85}Ge_{0.15}$ uniform composition layer of which the Ge concentration is constantly 15% was epitaxially grown thereon to a film thickness of 20 nm.

Thereafter, on the surface of this layer, a strained Si layer was formed by changing the film thickness so as to prepare six samples of strained silicon wafers (Examples 1 to 6).

Comparative Examples 1 to 6

An $Si_{1-x}Ge_x$ composition-graded layer and an $Si_{0.8}Ge_{0.2}$ uniform composition layer were epitaxially grown in the same manner as in Examples above.

Subsequently, a strained layer was formed thereon by changing the film thickness in the same manner as in Examples to produce six samples of strained silicon wafers (Comparative Examples 1 to 6).

Comparative Examples 7 to 12

On the surface of a single crystal silicon substrate, a first SiGe layer having a Ge concentration of 15% was epitaxially grown to a film thickness of 100 nm and then, a uniform composition SiGe layer and a compositionally gradient SiGe layer were alternately and continuously stacked to stepwisely vary the Ge concentration from 0% to 20%.

Subsequently, an $Si_{0.8}Ge_{0.2}$ uniform composition layer was epitaxially grown thereon in the same manner as in the above Examples. Furthermore, a strained Si layer was formed thereon by changing the film thickness in the same manner as in the Examples to produce 6 samples of strained silicon wafers (Comparative Examples 7 to 12).

Such a mode of varying the Ge concentration is a technique of converging dislocations by the first SiGe layer.

The strained silicon wafers obtained in Examples 1 to 6 and Comparative Examples 1 to 12 each was selectively etched to a depth of 100 nm with a Secco solution (HF (49%): $K_2Cr_2O_7$ (0.15 mol/liter)=2:1), and numbers of pits after etching were counted, whereby the penetrating dislocation density was evaluated.

Based on these results, the penetrating dislocation densities of the strained silicon wafer at respective film thickness of the strained Si layer are shown together in Table 1.

Also, FIG. 1 simply shows the Ge concentration profile for the SiGe layer before the formation of strained Si layer in Examples and Comparative Examples.

TABLE 1

| Thickness of Strained Si Layer (nm) | Example | Penetrating Dislocation Density ($cm^{-2}$) | Comparative Example | Penetrating Dislocation Density ($cm^{-2}$) | Comparative Example | Penetrating Dislocation Density ($cm^{-2}$) |
|---|---|---|---|---|---|---|
| 5 | 1 | $3.4 \times 10^2$ | 1 | $5.5 \times 10^2$ | 7 | $5.0 \times 10^2$ |
| 7 | 2 | $5.3 \times 10^2$ | 2 | $5.8 \times 10^2$ | 8 | $5.2 \times 10^2$ |
| 10 | 3 | $8.2 \times 10^2$ | 3 | $8.4 \times 10^4$ | 9 | $8.0 \times 10^4$ |
| 15 | 4 | $2.2 \times 10^3$ | 4 | $3.1 \times 10^5$ | 10 | $1.5 \times 10^5$ |
| 20 | 5 | $2.5 \times 10^3$ | 5 | $4.7 \times 10^5$ | 11 | $3.8 \times 10^5$ |
| 25 | 6 | $5.8 \times 10^3$ | 6 | $3.8 \times 10^6$ | 12 | $2.5 \times 10^5$ |

As seen from Table 1, it was verified that when an SiGe layer having a Ge concentration of 15% was formed on an SiGe layer having a Ge concentration of 20% (Examples), irrespective of the thickness of the strained Si layer, the penetrating dislocation density was reduced as compared with a strained silicon wafer of which the Ge concentration in the SiGe layer right under the strained Si layer was still 20% (Comparative Examples).

In Comparative Examples where the Ge concentration in the SiGe layer right under the strained Si layer was still 20%, when the film thickness of the strained Si layer became 10 nm or more (Comparative Examples 3 to 6), the penetrating dislocation density was greatly increased to $10^4$ $cm^{-2}$ or more.

Furthermore, even in the case of using a technique of converging dislocations by the first SiGe layer, similarly, when the film thickness of the strained Si layer was 10 nm or more (Examples 9 to 12), the penetrating dislocation density was greatly increased to $10^4$ $cm^{-2}$ or more.

On the other hand, in Examples where a strained Si layer was formed on an SiGe layer having a Ge concentration of 15%, even when the film thickness of the strained Si layer was 10 nm or more (Examples 3 to 6), the penetrating dislocation density was less than $10^4$ cm$^{-2}$ and thus remarkably reduced.

While there has been described in connection with the preferred embodiments of the present invention, it will be obvious to those skilled in the art that various changes and modification may be made therein without departing from the present invention, and it is aimed, therefore, to cover in the appended claim all such changes and modifications as fall within the true spirit and scope of the present invention.

What is claimed is:

1. A manufacturing method for producing a strained silicon wafer, comprising the steps of:

forming an $Si_{1-x}Ge_x$ composition-graded layer that has a Ge concentration that is stepwisely increased on a single crystal silicon substrate;

forming an $Si_{1-x}Ge_x$ uniform composition layer having a constant Ge concentration on the $Si_{1-x}Ge_x$ composition-graded layer;

forming a strain-relaxed $Si_{1-y}Ge_y$ layer having a Ge concentration y that is constant, wherein y satisfies the relationship $0.5x \leq y < x$, wherein the strain-relaxed layer is formed on the $Si_{1-x}Ge_x$ uniform composition layer; and epitaxially growing a strained Si layer on the strain-relaxed $Si_{1-y}Ge_y$ layer.

2. The manufacturing method of claim 1, wherein the Ge concentration of the $Si_{1-x}Ge_x$ composition-graded layer increases at a gradient less than 25%/μm.

3. The manufacturing method of claim 1, wherein the $Si_{1-x}Ge_x$ composition-graded layer is formed to a thickness of 1-3 μm.

4. The manufacturing method of claim 1, wherein the $Si_{1-x}Ge_x$ uniform composition layer is formed to a thickness of 500-1000 nm.

5. The manufacturing method of claim 1, wherein the strain relaxed $Si_{1-y}Ge_y$ layer is formed to a thickness of 10-200 nm.

6. The manufacturing method of claim 1, wherein the strained Si layer is grown to a thickness of 5-50 nm.

7. The manufacturing method of claim 1, further comprising a step of subjecting a surface of the strain-relaxed $Si_{1-y}Ge_y$ layer to a high temperature hydrogen heat treatment before forming the strained Si layer.

* * * * *